United States Patent [19]

Myers

[11] Patent Number: 5,572,161

[45] Date of Patent: Nov. 5, 1996

[54] TEMPERATURE INSENSITIVE FILTER TUNING NETWORK AND METHOD

[75] Inventor: Brent A. Myers, Palm Bay, Fla.

[73] Assignee: Harris Corporation, Melbourne, Fla.

[21] Appl. No.: 497,045

[22] Filed: Jun. 30, 1995

[51] Int. Cl.$^6$ .......................... H03K 17/687; G05F 3/26
[52] U.S. Cl. .......................... 327/538; 327/552; 327/553; 327/362; 327/378; 327/535; 327/530; 323/312; 323/315; 323/316; 330/309
[58] Field of Search ................................ 327/553, 362, 327/378, 391, 538, 539, 540, 541, 322, 552, 530; 330/305, 309, 307; 323/315, 316, 311, 312, 313, 314

[56] References Cited

U.S. PATENT DOCUMENTS

| | | | |
|---|---|---|---|
| 4,495,425 | 1/1985 | McKenzie | 327/541 |
| 5,038,053 | 8/1991 | Djenguerian et al. | 327/513 |
| 5,081,380 | 1/1992 | Chen | 327/262 |
| 5,107,199 | 4/1992 | Vo et al. | 323/316 |
| 5,124,593 | 6/1992 | Michel | 327/554 |
| 5,402,064 | 3/1995 | Eck et al. | 322/510 |

FOREIGN PATENT DOCUMENTS

| | | | |
|---|---|---|---|
| 8202624 | 11/1983 | Japan | 327/538 |
| 3278417 | 11/1988 | Japan | 327/538 |

*Primary Examiner*—Timothy P. Callahan
*Assistant Examiner*—Dinh T. Le
*Attorney, Agent, or Firm*—Rogers & Killeen

[57] ABSTRACT

A method and circuit for tuning an equivalent resistor in a filter so that the filter is insensitive to temperature changes in which an amplifier output is connected to a common gate of plural MOSFETs for providing equivalent resistances, and in which one input to the amplifier is connected to a reference resistor and the other input to the amplifier is connected to an equivalent resistor that includes one of the plural MOSFETs. An input current to the reference resistor and to the equivalent resistor's MOSFET is inversely proportional to the MOSFET's conduction parameter, k (i.e., $\mu C_{ox}/2$), so that both the inputs to the amplifier vary to change the amplifier output voltage to the common gate. The amplifier output changes render the filter insensitive to temperature changes.

18 Claims, 2 Drawing Sheets

5,572,161

TEMPERATURE INSENSITIVE FILTER TUNING NETWORK AND METHOD

BACKGROUND OF THE INVENTION

The present invention is related to circuits and methods for compensating for temperature changes in resistive circuits, and more specifically to a method and circuit for tuning an equivalent resistor in a filter so that the filter is insensitive to temperature changes.

Various types of electronic components require resistive circuits that are relatively insensitive to temperature. For example, filters for communication devices, such as for baseband signal and intermediate frequency filtering, require very accurate frequency response, but include resistors that have temperature sensitive resistance values. As the temperature changes, the resistance changes, thereby causing the filter to drift from a desired frequency.

Various methods for tuning a filter to the proper frequency in a communication device have been devised, but performance has limited their use. For example, filter tuning may be accomplished with a phase locked loop and a voltage controlled oscillator. However, these components require space, and in some filters, especially monolithic filters, space is expensive and the use of components that require space is desirably avoided. Further, a voltage controlled oscillator in a monolithic filter may increase noise and degrade performance.

In the present invention, a resistor in a filter is replaced with an equivalent resistor that includes a MOSFET that is operated in its linear region. The resistance of the equivalent resistor may be varied (that is, the filter may be tuned) by varying the voltage applied to the MOSFET gate to compensate for temperature changes. The mere use of equivalent resistors with MOSFETs does not necessarily solve the problems of the prior art, because a method of providing the correct voltage to the MOSFET gate to compensate for temperature changes must still be provided.

The prior art offers a solution that is improved upon in the present invention. With reference to FIG. 1, an equivalent resistor 10 with a MOSFET 12 may have a MOSFET gate voltage provided by an amplifier 14. Amplifier 14 has a reference voltage input 16 and a second input 18 that is a voltage across a second equivalent resistor 20 when a temperature insensitive reference current Iref is provided to second equivalent resistor 20 from current source 22. Second equivalent resistor 20 includes MOSFET 24 having a common gate with MOSFET 12 in first equivalent resistor 10. In operation, amplifier 14 senses a difference between a constant Vref and the changing voltage across second equivalent resistor 20. Amplifier 14 output thereby adjusts the voltage to the common gate to vary the resistance in first equivalent resistor 10 to thereby tune a filter that includes first equivalent resistor 10. See, for example, U.S. Pat. No. 5,107,199 issued Apr. 21, 1992 to Vo, et al.

The method of using a temperature insensitive Iref suggested by Vo, et al. removes some of the temperature-induced resistance variation from first equivalent resistor 20, and thus may be satisfactory for some applications. However, this method does not take advantage of further reductions in temperature-induced resistance variations that are available using the method and circuit of the present invention. In contrast to Vo, et al., the present invention uses a current source that is temperature sensitive so that a current used to generate inputs to the amplifier varies, preferably in inverse proportion to the conduction parameter, k (i.e., $\mu C_{ox}/2$), of the MOSFET. As will be demonstrated, the use of a current source that is temperature sensitive reduces temperature-induced variations in resistance significantly beyond that available from the method of Vo, et al.

Accordingly, it is an object of the present invention to provide a novel method and circuit for compensating for temperature changes in a resistive circuit that obviates the problems of the prior art.

It is another object of the present invention to provide a novel method and circuit for compensating for temperature changes in a resistive circuit in which a current source provides inputs to a feedback amplifier that vary with temperature so that an output from the amplifier compensates for temperature changes.

It is yet another object of the present invention to provide a novel method and circuit for compensating for temperature changes in which a current source provides an input current for a feedback amplifier that varies in inverse proportion to a conduction parameter, k, of a MOSFET in the circuit.

It is still another object of the present invention to provide a novel method and circuit that decreases the temperature induced variation of resistance of a resistive element by using a temperature dependent current source instead of a temperature independent current source to control a feedback amplifier that adjusts a current across the resistive element.

It is a further object of the present invention to provide a novel method and circuit for tuning a resistor in a filter so that the filter is insensitive to temperature changes.

It is yet a further object of the present invention to provide a novel method and circuit for tuning a resistor in a filter in which a first equivalent resistor that is not part of the filter is operated with a temperature dependent input current so that a second equivalent resistor that is connected to the first equivalent resistor and that is part of the filter is compensated for temperature changes.

It is still a further object of the present invention to provide a novel method and circuit for tuning a resistor in a filter in which a first equivalent resistor that is not part of the filter is operated with an input current that is inversely proportional to the conduction parameter, k, of a MOSFET in the equivalent resistor.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 2:
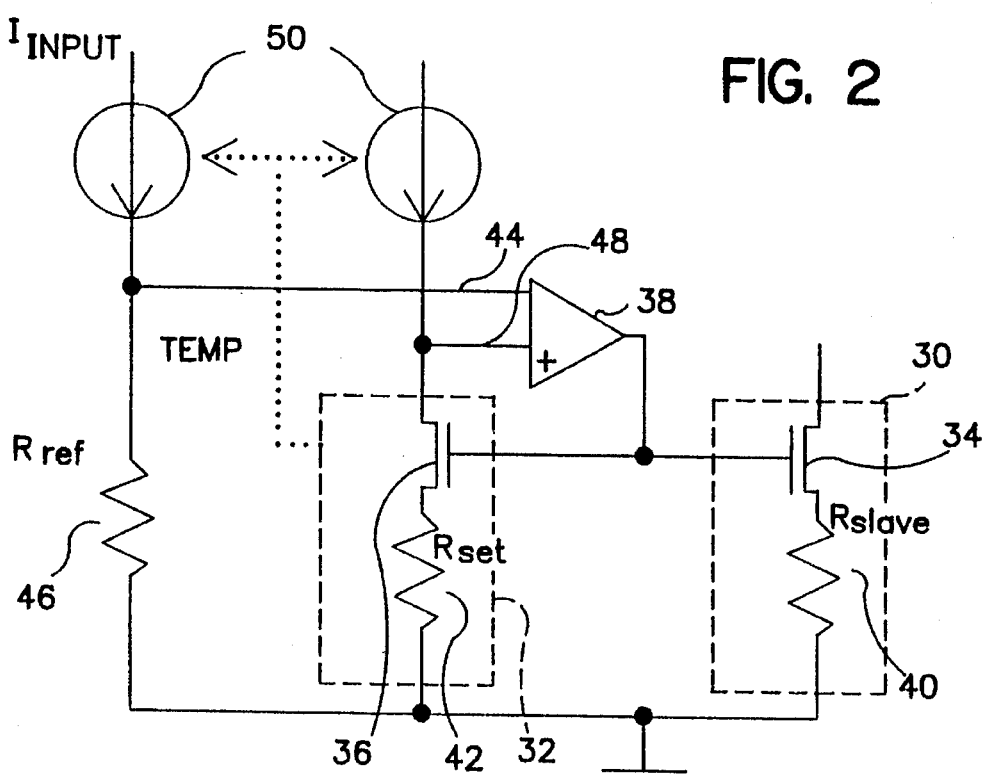
FIG. 2 is a circuit diagram of an embodiment of the present invention.

With reference now to FIG. 2, an embodiment of the present invention may include a first equivalent resistor 30 (a slave component) that may be part of a resistive circuit, such as a filter, and a second equivalent resistor 32 (a master component) that is not part of the resistive circuit. First equivalent resistor 30 has a MOSFET 34 having a common gate with MOSFET 36 in second first equivalent resistor 32. MOSFETs 34 and 36 are desirably identical and in the same monolithic device so when amplifier 38 provides a gate voltage to the common gate, the reactions of MOSFETS 34 and 36 are the same, or nearly so. Resistors 40 (Rslave) and 42 (Rset) in the equivalent resistors are desirably of known resistance and are temperature insensitive, and to this end may be NiCr resistors.

Amplifier 38 may receive two inputs: a first input 44 that is a voltage across a reference resistor 46 (which may be a temperature insensitive external resistor), and a second input 48 that is a voltage across second equivalent resistor 32. A current source 50 provides an input current to reference resistor 46 and second equivalent resistor 32 that is sensitive to device temperature.

Since the operating points of MOSFETs 34 and 36 are not necessarily identical, temperature changes cause their conduction parameter, k, to vary, and as a result a temperature induced difference between the resistance of the second equivalent resistor 32 (master component) and the first equivalent resistor 30 (slave component) is generated. It can be shown that the difference in resistance $\Delta R$ is given by:

$$\Delta R = \frac{1}{\left(2 \frac{W}{L} k\right) I_{input} \cdot (R_{ref} - R_{set})} \quad (1)$$

where W and L are the drawn channel width and length of the master and slave MOSFETs 36 and 34, and k is the MOSFET conduction parameter. Since k is a temperature dependent quantity (by virtue of the temperature dependence of the mobility of carriers), $\Delta R$ has a temperature dependence. By inspection, it can be seen that if Iinput is inversely proportional to k, then temperature dependence is eliminated. The operation of the circuit of FIG. 2 is similar to that of the circuit of FIG. 1, except that current source 50 now is temperature sensitive, so that Iinput varies in the required manner.

Figure 1:
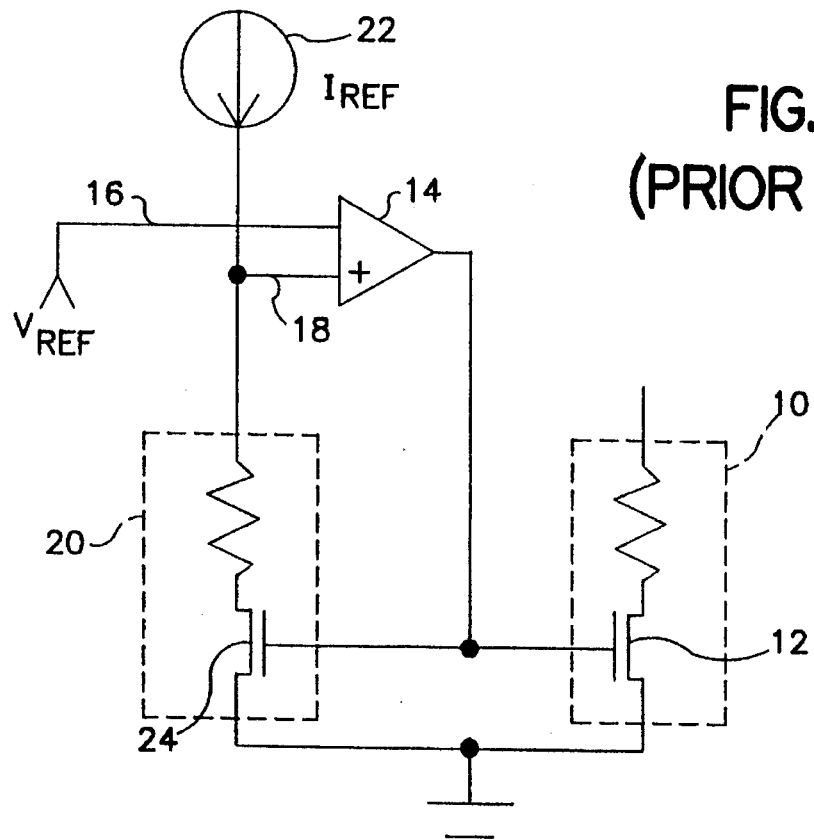
FIG. 1 is a circuit diagram of a temperature compensation circuit of the prior art.

In a simulation of the operation of the circuits of FIGS. 1 and 2 under identical conditions, it was shown that a change in device temperature from 0° C. to 100° C. caused about a 210Ω change (from 6385 to 6595Ω) in an equivalent resistor when the input current was constant (Iref of FIG. 1). On the other hand, a change in device temperature from 0° C. to 100° C. caused only about a 60Ω change (from 6470 to 6410Ω) in the equivalent resistor when the input current was varied as in the present invention (Iinput of FIG. 2). Under the conditions of the simulation, the present invention offered an improvement of better than three to one.

In a preferred embodiment of the present invention that may find application in a monolithic filter, Iinput may be provided by a biasing circuit that provides an input current that varies in inverse proportion to conduction parameter, k. Biasing circuits that perform this function are known as $\Delta V_{gs}$ generators, and one is illustrated in FIG. 3 where devices 54 through 59 comprise a generator which provides the necessary current relationship to k.

Figure 3:
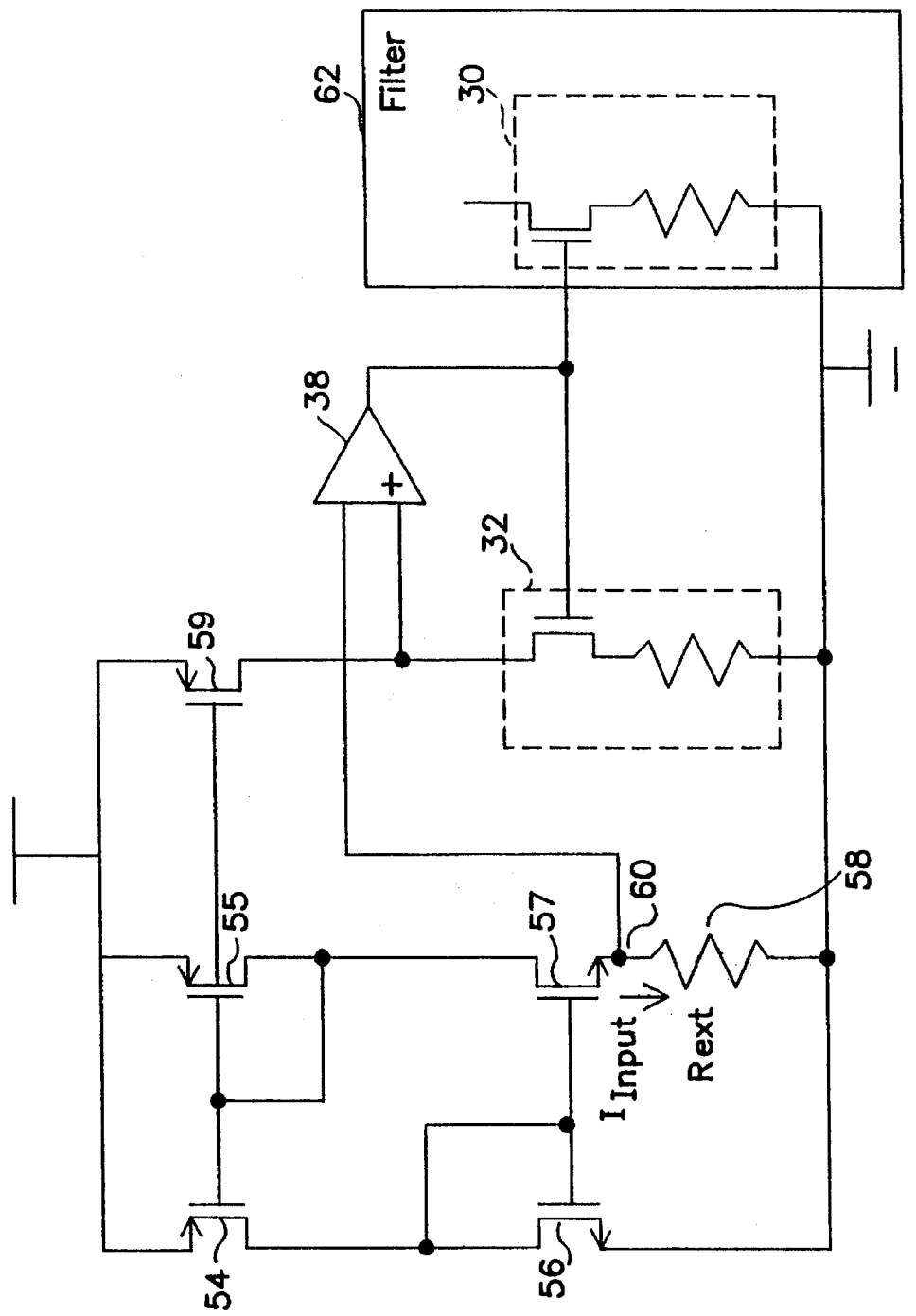
FIG. 3 is a circuit diagram of a further embodiment of the present invention.

The circuit of FIG. 3 may include two MOSFETs 54 and 55 of a first type (n-type shown by way of illustration) with a common gate and two MOSFETs 56 and 57 of a second type with a second common gate. MOSFET 54 and MOSFET 56 have a common drain, and MOSFET 55 and MOSFET 57 have a common drain. The MOSFETs are not necessarily identical in size. One of the common gates is connected to one of the common drains and the other of the common gates is connected to the other of the common drains, such as illustrated in FIG. 3. The reference resistor 58 Rext may be connected to a source of MOSFET 57. The current Iinput at node 60 provides a voltage across reference resistor 58 that varies in proportion to $\Delta V_{gs}$ and in inverse proportion to k. With the exception of resistor 58, the entirety of the circuit of FIG. 3 may be in a single integrated circuit in a monolithic filter 62, using less of the valuable real estate than the PLLs and VCOs of the prior art without the noise associated with VCOs. Resistor 58 may be an external precision resistor which provides the accurate tuning reference for the slaved filter network.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a method of compensating for temperature changes in a resistive circuit in which an amplifier output adjusts a gate voltage applied to a common gate of plural MOSFETs to vary equivalent resistances provided by the plural MOSFETs, and in which the inputs to the amplifier are a first voltage across a reference resistor and a second voltage across an equivalent resistor that includes a first one of the plural MOSFETs, the improvement comprising the steps of:

(a) providing an input current across the reference resistor and across the equivalent resistor; and (b) varying the input current in inverse proportion to the first MOSFET temperature-dependent conduction parameter, k, whereby both the first and second voltages vary so that the amplifier output adjusts the gate voltage to compensate for temperature changes.

2. The method of claim 1 wherein each of the reference resistor and the equivalent resistor comprise a resistor that is insensitive to temperature changes.

3. In a circuit for tuning a resistor in a filter so that the filter is insensitive to temperature changes in which an amplifier output is connected to a common gate of plural MOSFETs for providing equivalent resistances, where a first equivalent resistor is part of the filter and includes a first one of the plural MOSFETs, and in which one input to the amplifier is connected to a reference resistor and the other input to the amplifier is connected to a second equivalent resistor that includes a second one of the plural MOSFETs, the improvement comprising:

a current source for providing an input current to the reference resistor and to the second equivalent resistor that is inversely proportional to the second MOSFET conduction parameter, k, whereby when said current source is providing said input current, both the inputs to the amplifier vary so that the output from the amplifier adjusts a voltage at the common gate to make the filter insensitive to temperature changes.

4. The circuit of claim 3 wherein each of the reference resistor and the second equivalent resistor comprise a temperature-insensitive resistor.

5. The circuit of claim 3 wherein said current source comprises:

two first type MOSFETs with a first common gate and two second type MOSFETs with a second common gate, one of said first type MOSFETs and one of said second type MOSFETs having a first common drain, and the other of said first type MOSFETs and the other of said second type MOSFETs having a second common drain, said first common gate being connected to said first common drain and said second common gate being connected to said second common drain.

6. The circuit of claim 5 wherein the reference resistor is connected to a source of one of said second type MOSFETs.

7. The circuit of claim 6 wherein the reference resistor comprises an external resistor.

8. A circuit for tuning a resistor in a filter so that the filter is insensitive to temperature changes, the circuit comprising:

a first equivalent resistor comprising a first MOSFET, said first equivalent resistor being part of the filter;

a second equivalent resistor comprising a second MOSFET, said first and second MOSFETs having a common gate;

a reference resistor of predetermined resistance for controlling said second equivalent resistor;

a current source for providing an input current to said reference resistor and to said second equivalent resistor that is inversely proportional to said second MOSFET conduction parameter, k; and an amplifier having a first input that is the voltage across said second equivalent resistor and a second input that is the voltage across said reference resistor, and an output connected to said common gate, whereby when said current source is providing said input current, both said first and second inputs to said amplifier vary so that said output from said amplifier adjusts a voltage at said common gate to make the filter insensitive to temperature changes.

9. The circuit of claim 8 wherein said first and second equivalent resistors each further comprise a NiCr resistor.

10. The circuit of claim 8 wherein said current source comprises:

two first type MOSFETs with a first common gate and two second type MOSFETs with a second common gate, one of said first type MOSFETs and one of said second type MOSFETs having a first common drain, and the other of said first type MOSFETs and the other of said second type MOSFETs having a second common drain, said first common gate being connected to said first common drain and said second common gate being connected to said second common drain.

11. The circuit of claim 10 wherein said reference resistor is connected to a source of one of said second type MOSFETs.

12. A resistive circuit that is compensated for temperature changes, the circuit comprising:

a first equivalent resistor comprising a first MOSFET;

a second equivalent resistor comprising a second MOSFET, said first and second MOSFETs having a common gate;

a current source for providing an input current to said second equivalent resistor that varies in inverse proportion to said second MOSFET conduction parameter, k; and an amplifier having a first input voltage that is the voltage across said second equivalent resistor when said input current is applied thereto, and a second input voltage related to said input current, and an output connected to said common gate, whereby when said current source is providing said input current, both said first and second inputs to said amplifier vary so that said output from said amplifier adjusts a voltage at said common gate to compensate for temperature changes.

13. The circuit of claim 12 wherein said first and second equivalent resistors each further comprise a NiCr resistor.

14. The circuit of claim 12 further comprising a reference resistor for providing said second input voltage when said input current is applied thereto.

15. The circuit of claim 12 wherein said current source comprises:

a first pair of MOSFETs having a first common gate and a second pair of MOSFETs having a second common gate, one of said first pair of MOSFETs and one of said second pair of MOSFETs having a first common drain, and the other of said first pair of MOSFETs and the other of said second pair of MOSFETs having a second common drain, said first common gate being connected to said first common drain and said second common gate being connected to said second common drain.

16. The circuit of claim 15 further comprising a temperature-insensitive reference resistor that is connected to a source of one of said second pair of MOSFETs for providing said second input voltage when said input current is applied thereto.

17. In a circuit for tuning a resistor in a filter so that the filter is insensitive to temperature changes in which an amplifier output is connected to a common gate of plural MOSFETs for providing equivalent resistances, where a first equivalent resistor is part of the filter and includes a first one of the plural MOSFETs, and in which one input to the amplifier is connected to a reference resistor and the other input to the amplifier is connected to a second equivalent resistor that includes a second one of the plural MOSFETs, the improvement comprising:

a current source for providing an input current to the reference resistor and to the second equivalent resistor that is inversely proportional to the second MOSFET conduction parameter, k, said current source comprising, two first type MOSFETs with a first common gate and two second type MOSFETs with a second common gate, one of said first type MOSFETs and one of said second type MOSFETs having a first common drain, and the other of said first type MOSFETs and the other of said second type MOSFETs having a second common drain, said first common gate being connected to said first common drain and said second common gate being connected to said second common drain;

whereby when said current source is providing said input current, both the inputs to the amplifier vary so that the output from the amplifier adjusts a voltage at the common gate to make the filter insensitive to temperature changes.

18. A resistive circuit that is compensated for temperature changes, the circuit comprising:

a first equivalent resistor comprising a first MOSFET;

a second equivalent resistor comprising a second MOSFET, said first and second MOSFETs having a common gate;

a current source for providing an input current to said second equivalent resistor that varies in inverse proportion to said second MOSFET conduction parameter, k, said current source comprising, a first pair of MOSFETs having a first common gate and a second pair of MOSFETs having a second common gate, one of said first pair of MOSFETs and one of said second pair of MOSFETs having a first common drain, and the other of said first pair of MOSFETs and the other of said second pair of MOSFETs having a second common drain, and said first common gate being connected to said first common drain and said second common gate being connected to said second common drain; and an amplifier having a first input voltage that is the voltage across said second equivalent resistor when said input current is applied thereto, and a second input voltage related to said input current, and an output connected to said common gate, whereby when said current source is providing said input current, both said first and second inputs to said amplifier vary so that said output from said amplifier adjusts a voltage at said common gate to compensate for temperature changes.

\* \* \* \* \*